(12) United States Patent
Katzenberger et al.

(10) Patent No.: US 12,071,071 B2
(45) Date of Patent: Aug. 27, 2024

(54) VEHICLE STEERING WHEEL WITH AN IMPROVED ELECTROMECHANICAL TRIGGERING DEVICE FOR TRIGGERING AN ACOUSTIC OUTPUT BY AN ACOUSTIC WARNING DEVICE OF THE VEHICLE

(71) Applicant: Preh GmbH, Bad Neustadt a.d. Saale (DE)

(72) Inventors: Oliver Katzenberger, Burglauer (DE); Stefan Wahl, Bad Neustadt a.d. Saale (DE); Dirk Ruetzel, Ebersburg (DE); Martin Schäfer, Hohenroth (DE); Sebastian Schrenk, Oberelsbach-Ginolfs (DE)

(73) Assignee: PREH GMBH, Bad Neustadt a. d. Saale (DE)

( * ) Notice: Subject to any disclaimer, the term of this patent is extended or adjusted under 35 U.S.C. 154(b) by 281 days.

(21) Appl. No.: 17/442,304

(22) PCT Filed: Feb. 17, 2020

(86) PCT No.: PCT/EP2020/054063
§ 371 (c)(1),
(2) Date: Sep. 23, 2021

(87) PCT Pub. No.: WO2020/200571
PCT Pub. Date: Oct. 8, 2020

(65) Prior Publication Data
US 2022/0153193 A1    May 19, 2022

(30) Foreign Application Priority Data

Apr. 1, 2019  (DE) .......................... 102019108460.1
Oct. 9, 2019  (DE) .......................... 102019127120.7

(51) Int. Cl.
*B60Q 5/00*     (2006.01)
*B60R 21/203*   (2006.01)
*B62D 1/04*     (2006.01)

(52) U.S. Cl.
CPC .......... *B60Q 5/003* (2013.01); *B60R 21/2037* (2013.01); *B62D 1/046* (2013.01)

(58) Field of Classification Search
CPC . B60Q 5/003; B60Q 1/00; B60Q 5/00; B60Q 5/001; B60R 21/16; B60R 21/20;
(Continued)

(56) References Cited

U.S. PATENT DOCUMENTS

| 6,909,063 B2 * | 6/2005 | Nam | H01H 13/7006 |
| | | | 200/406 |
| 2002/0126004 A1 * | 9/2002 | Gioutsos | B60Q 5/003 |
| | | | 340/438 |

(Continued)

FOREIGN PATENT DOCUMENTS

| DE | 29805207 U1 | 6/1998 |
| DE | 20116306 U1 | 2/2002 |

(Continued)

OTHER PUBLICATIONS

International Search Report and Written Opinion of International Searching Authority for PCT/EP2020/054063, ISA/NL, Rijswijk, Netherlands, Dated: May 4, 2020.

(Continued)

*Primary Examiner* — Anthony R Jimenez
(74) *Attorney, Agent, or Firm* — M&B IP Analysts, LLC

(57) ABSTRACT

The present disclosure relates to a vehicle steering wheel, including: a steering wheel body with a hub region for attachment to a steering shaft, with a steering wheel rim and with at least one spoke for attaching the steering wheel rim to the hub region; an airbag initiation device; wherein an (Continued)

electromechanical triggering device has at least one force transducer, which is disposed between a projection and the steering wheel body and via which the impact absorber cover is supported on the steering wheel body, for measuring a force value that can be associated with an actuating force acting on the actuating surface of the impact absorber cover; wherein the electromechanical triggering device has at least one electronic evaluation unit connected in an electrically conductive manner to the force transducer to determine an actuating force value by a force value measured by the at least one force transducer.

20 Claims, 5 Drawing Sheets

(58) Field of Classification Search
CPC .............. B60R 21/2037; B60R 21/203; B60R 2021/01204; B62D 1/00; B62D 1/04; B62D 1/046; B62D 1/06; B62D 1/08; H01H 3/00; H01H 3/02; H01H 3/12; H01H 9/00; H01H 9/02; H01H 9/0242; H01H 9/06; H01H 9/20; H01H 9/22; H01H 13/00; H01H 13/04; H01H 13/14; H01H 13/50; H01H 13/52; H01H 2003/12; H01H 2009/02; H01H 2009/0285; H01H 2231/026; B60K 2370/70; B60K 2370/782; G05G 1/00; G05G 1/02

USPC .................................................... 200/61.54
See application file for complete search history.

(56) References Cited

U.S. PATENT DOCUMENTS

| 2005/0012310 | A1  | 1/2005 | Rhea |
|---|---|---|---|
| 2006/0028002 | A1* | 2/2006 | Tsujimoto .............. B60Q 5/003 280/731 |
| 2007/0216143 | A1* | 9/2007 | Vazquez ............. B60R 21/2037 200/61.55 |

FOREIGN PATENT DOCUMENTS

| DE | 102009043601 A1 | 1/2015 |
|---|---|---|
| EP | 1623886 A2 | 2/2006 |
| GB | 2309123 A | 7/1997 |

OTHER PUBLICATIONS

German Office Action for application No. DE102019127120.7, dated Nov. 27, 2023. German Patent and Trademark Office, Munich Germany.

* cited by examiner

VEHICLE STEERING WHEEL WITH AN IMPROVED ELECTROMECHANICAL TRIGGERING DEVICE FOR TRIGGERING AN ACOUSTIC OUTPUT BY AN ACOUSTIC WARNING DEVICE OF THE VEHICLE

The present disclosure relates to a vehicle steering wheel with an improved electromechanical triggering device for triggering an acoustic output by means of an acoustic warning device of the vehicle, i.e. for outputting an acoustic horn signal by means of a motor vehicle horn, for example. A vehicle steering wheel typically has a hub region (also called hub in short) for attachment to a steering shaft, a steering wheel rim and at least one spoke for supporting the steering wheel rim on the hub region.

In this case, the impact absorber cover covering the hub of the steering wheel typically forms the operating surface for an electromechanical button, by the impact absorber cover being pressed down for triggering the horn. The triggering should only be effected in the case of a targeted, intended actuation, and not in the case of an accidental contact. Since the impact absorber cover at the same time forms the cover for an airbag initiation device disposed in the region of the hub of the steering wheel, the designer is presented with some difficulties when it comes to positioning the button for triggering the horn signal in a clever manner. In general, the airbag initiation device consists of a gas bag having a volume of about 67 l, a gas bag holder, a generator and a generator support. The impact absorber cover is typically attached to the airbag initiation device and the above-mentioned button is disposed between the steering wheel body and the airbag initiation device. This not only entails mechanical disadvantages with respect to the force path in the transmission of the actuating force when the so-called horn signal is triggered, but also has disadvantages in the optical and mechanical design of the steering wheel surface configuration. Because the impact absorber cover, together with the airbag initiation device, is to be movably mounted on the steering wheel body in the known solutions, an almost gap-free transition between the actuating surface of the impact absorber cover and the surface of the steering wheel body, particularly in the region of the spoke, which is intended for optical and injury-related reasons, cannot be realized.

Therefore, the present disclosure is based on the object of providing a vehicle steering wheel, also called steering wheel in short, with an improved mechanical and optical integration of an electromechanical triggering device for triggering an acoustic output by means of an acoustic warning device of the vehicle, which is improved particularly with respect to the detection of the actuating force and is realized in a construction space-saving manner. According to the present disclosure, the object is achieved by a vehicle steering wheel with the features of claim 1. An equally advantageous use is the subject matter of the independent claim. It must be noted that the features and measures cited individually in the following description can be combined with each other in any technologically meaningful manner and represent other embodiments of the present disclosure. The description, in particular in connection with the figures, additionally characterizes and specifies the present disclosure.

The vehicle steering wheel according to the present disclosure includes a steering wheel body with a hub region configured for attachment to a steering shaft, a steering wheel rim and at least one spoke for attaching the steering wheel rim to the hub region. The steering wheel rim forms the gripping surface of the steering wheel and is usually formed as a closed ring and serves for the steering adjustment of a steering system by rotating the vehicle steering wheel about its axis of rotation. The steering wheel rim does not necessarily have to be closed; thus, an embodiment of the present disclosure is also conceivable in which the steering wheel rim forms only a part of the ring. For example, the steering wheel rim forms a so-called steering horn as a gripping surface, which is connected to a single spoke, or forms a half to three-quarter circle, wherein it is connected to one, two or more spokes.

The vehicle steering wheel according to the present disclosure further comprises an airbag initiation device. For example, this includes a gas bag (also referred to as an "air bag"), a gas bag holder, a generator for generating a gas filling the gas bag, and a generator support.

According to the present disclosure, an electromechanical triggering device is also provided for triggering an acoustic output by means of an acoustic warning device of the vehicle. The triggering device provided according to the present disclosure has an impact absorber cover (also called "cap" in short), which covers the hub region on the steering wheel body at least partially while forming an actuating surface. The impact absorber cover is configured so as the bridge an accommodating space, which is provided between the hub region and the impact absorber cover and provided for at least partially accommodating the airbag initiation device, preferably bridging it in a cantilevered manner, i.e. without a central support between the outer supports on the steering wheel body. For example, the airbag initiation device is fixed to the steering wheel body. The impact absorber cover is mounted on the steering wheel body so as to be displaceable, in an elastically self-resetting manner, in the direction of the hub region under the influence of an actuating force on the actuating surface, and/or configured so as to be deformable, in an elastically self-resetting manner, in the direction of the hub region. A displacement is understood to be already a positional change of a fraction, such as a tenth, of a millimeter. According to the present disclosure, it has at least one projection projecting laterally in the direction of the steering wheel rim beyond the accommodating space. For example, two diametrically opposite projections are provided, which point away from one another and respectively extend along a spoke of the steering wheel body.

According to the present disclosure, the electromechanical triggering device further has at least one, preferably three or more, force transducer, which is disposed between the projection and the steering wheel body and via which the impact absorber cover is supported on the steering wheel body, for measuring a force value that can be associated with an actuating force acting on the actuating surface of the impact absorber cover.

According to the v electromechanical triggering device further has at least one electronic evaluation unit connected in an electrically conductive manner to the force transducer or force transducers in order to determine an actuating force value by means of the force value measured by the at least one force transducer and, if necessary, trigger the acoustic output of the acoustic warning device of the vehicle. Triggering takes place, for instance, when the actuating force value exceeds a predetermined threshold value. In the case of several force transducers, the actuating force value is determined by averaging all force values, optionally by weighted averaging of all force values. In this case, the weighting results from the inclination of the steering shaft or the steering column and/or the steering angle, each of which are detectable by means of sensors positioned correspondingly. In the case of several force transducers, the exceedance of a threshold value is determined by a central evaluating unit or a higher-level evaluating unit.

Due to the fact that the force transducer or force transducers is/are disposed between the impact absorber cover and the steering wheel body, a comparatively short force path between the actuating surface and the force transducer, which acts only via a single component, is obtained. This provides for an exact determination of the actuating force.

Preferably, the at least one force transducer is disposed outside the steering axis defined by the vehicle steering wheel, and more preferably outside the accommodating space provided for accommodating the airbag initiation device, most preferably is disposed radially next to the airbag initiation device.

Preferably, it is provided that the actuating surface extends across the accommodating space into the projection, preferably while forming a continuous transition. In other words, the projection or projections and the region of the impact absorber cover disposed above the accommodating portion form the actuating surface.

Preferably, at least two, e.g. three, force transducers are provided.

Preferably, the electronic evaluation unit has a central evaluating unit for determining an actuating force from force values of several, preferably all, force transducers. Alternatively, a master/slave system may be used in which an evaluating unit associated with a force transducer is provided as a higher-level master. For example, a bus system is provided for data communication between the force transducers.

Preferably, the force transducer is in each case disposed between the spoke of the steering wheel body and one of the projections.

Preferably, the force transducer is designed to measure the force value optically, capacitively, inductively or resistively. Preferably, an optically measuring force transducer is used. For example, an optical reflection measuring method is used in which the light intensity or the travel time of the light varies with the force to be measured. Preferably, means are provided for biasing the force transducer or force transducers, whereby influences of gravity on the impact absorber cover, which are dependent on the steering wheel position, can be minimized.

Preferably, a dome consisting of elastic material, such as an elastomer, rubber, etc., is provided as a resetting member causing the elastic resetting of the impact absorber cover. A dome is understood to be a hollow cone, for example.

Preferably, the force transducer is disposed in a hollow volume defined by the dome. For example, the dome has a hollow volume open towards one side, and the dome is placed over the force transducer. For example, light is emitted from the open end of the dome into the closed end of the dome, in order there to be reflected back in the direction of the open end, where it is finally received again. Accordingly, the light source and the receiver are disposed together on a circuit board extending underneath the dome and delimiting the hollow volume.

According to one configuration, several spokes are provided, and several projections on the impact absorber cover are provided, wherein the impact absorber cover extends from spoke to spoke, bridging the hub region.

Preferably, further, an electronic or electromechanical operating member disposed in the region of the spokes, in particular a multi-functional operating member (also called "mufu" in short), is provided, and the impact absorber cover is disposed adjacent to the operating member. A multi-functional operating member is understood to be an operating member with more than two control or switching functions. More preferably, the impact absorber cover is fixed to the operating member in at least one direction. For example, one operating member is disposed on each of two opposite spokes. For example, the operating member has a fingerprint sensor with a scanning surface for detecting biometric data and/or for cursor control by means of the detection of a fingerprint moving across the scanning surface.

In one configuration, a positioning protrusion is provided between the impact absorber cover and the operating member in order to ensure a predetermined relative orientation between the operating member and the impact absorber cover. For example, a pin is provided which reaches into a recess of the operating member.

Preferably, the impact absorber cover is fixed to the operating member via a snap-fit connection, which is also configured to have a limiting effect on the mobility of the impact absorber cover. For example, a latching lug, which engages a latching recess of a latching projection formed on the impact absorber cover, is formed on the operating member. For example, the snap-fit connection is configured in such a manner that the resetting member is biased in the rest position of the impact absorber cover.

Preferably, the force transducer is attached to a support of the operating member or attached to a circuit board of the operating member. For example, the light source and the receiver of the above-described optically detecting force transducer are disposed on the circuit board of the operating member, and the dome as a resetting member, which accommodates the light source and the receiver within its hollow volume, is supported with its open end on the circuit board.

Preferably, the operating member comprises an actuating part and/or a faceplate whose surface facing towards the driver transitions flush into the actuating surface of the impact absorber cover in the rest position of the actuating part and of the impact absorber cover.

Furthermore, the present disclosure relates to the use of the vehicle steering wheel in one of the above-described embodiments in a motor vehicle.

The various embodiments as well as the technical environment will be explained in more detail below with reference to the Figures. It must be remarked that the Figures depict a particularly preferred embodiment of the present disclosure, but that the present disclosure is not limited thereto. In the Figures.

Figure 1:
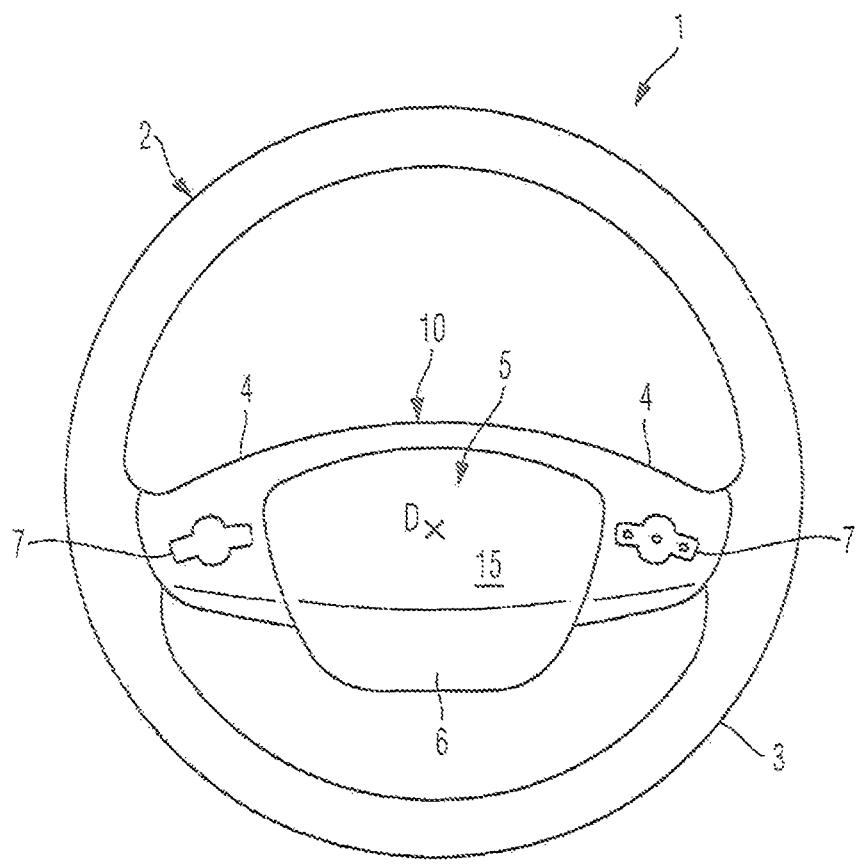
FIG. 1 shows a top view of an embodiment of the vehicle steering wheel 1 according to the embodiment.
Figure 2:
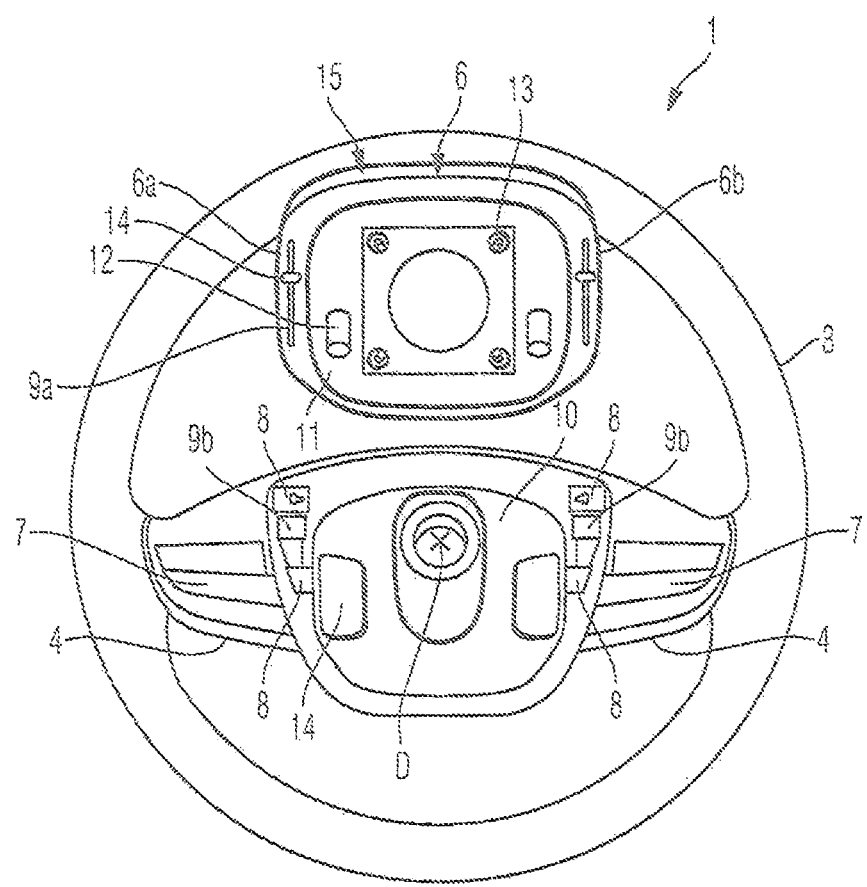
FIG. 2 shows a partial exploded view of the embodiment of the vehicle steering wheel 1 according to the embodiment shown in FIG. 1.
Figure 7:
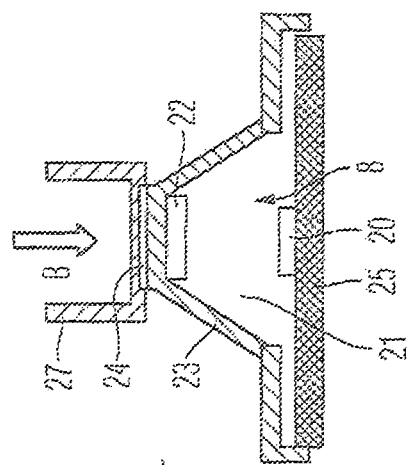
Figure 8:
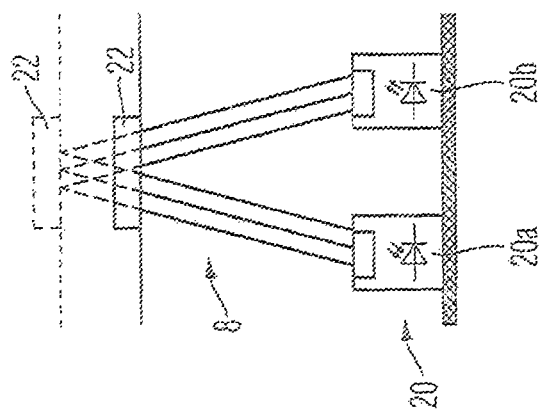

FIG. 7 shows a schematic view for illustrating the force transducer 8 of the embodiment of the vehicle steering wheel 1 according to the embodiment from FIGS. 1 and 2;

FIG. 8 shows another schematic view for illustrating the force transducer 8 of the embodiment of the vehicle steering wheel 1 according to the embodiment from FIGS. 1 and 2.

FIG. 1 shows an embodiment of the vehicle steering wheel 1 according to the embodiment in a top view. It includes a steering wheel body 2. In the center of the steering wheel body 2, the latter has a hub region 10 for attachment to a steering shaft of a vehicle steering system, which is not shown. Accordingly, the steering wheel serves for carrying out a steering adjustment by means of a rotation about a steering axis D. In FIG. 1, the hub region 10 is disposed underneath the impact absorber cover 6, which faces towards the driver and belongs to the electromechanical triggering device 5, which in turn is provided for triggering an acoustic output by means of an acoustic warning device, i.e. a horn device, of the vehicle, which is not shown. The steering wheel body 2 forms an annular steering wheel rim 3, which extends around the hub region 10 and which is supported on the hub region 10 by two diametrically opposite spokes 4 that extend in each case between the hub region 10 and the steering wheel rim 3. Facing towards the driver, one multi-functional operating member 7, which serves for manual operating inputs in order to control vehicle units, is provided in each case on the spokes 4. An airbag initiation device, which is not shown in FIG. 1, is located underneath the impact absorber cover 6 in the center of the steering wheel body 2 above the hub region 10. The impact absorber cover 6 provides an actuating surface 15 whose manual actuation with a predetermined actuating force results in a triggering of the acoustic output, as will be explained below. FIG. 2 is an exploded view in which the impact absorber cover 6 including the airbag initiation device is removed and which allows, on the one hand, a view onto the generator support 11, which is located underneath the airbag initiation device and which is covered in a cantilevered manner by the impact absorber cover 6, and on the other hand onto the hub region 10 of the steering wheel body 2.

For vibration decoupling, the generator support 11 is mounted on the hub region 10 with four vibration absorbers 13 consisting of rubber, wherein the two latching pins 12, which are provided on the generator support 11 and which are in latching engagement with the latching springs 14 provided on the hub region 10, cause a fixation on the hub region 10. The impact absorber cover 6 has lateral projections 6a, 6b, which extend along the spokes 4 in the direction of the steering wheel rim 3 and which form a positioning aid 14 and a latching projection 9b on the side facing away from the driver. The latching projection 9a cooperates with a latching lug 9b formed on the side of the operating member 7; thus, a snap-fit connection 9 with play is formed between the impact absorber cover 6 and, in each case, one of the multi-functional operating members 7 in order to limit the mobility of the impact absorber cover 6 in the direction of the actuation in such a way that in spite of this limitation, the impact absorber cover 6, under the influence of an actuating force on the actuating surface 15 in the direction of the hub region 10, remains mounted and movable, in an elastic and also resetting manner, on the steering wheel body 2.

The actuating force applied in the process is determined based on the displacement of the impact absorber cover 6 by means of the force transducers 8 associated with the electromechanical triggering device 5. The impact absorber cover 6 is supported on the steering wheel body 2 via the force transducer 8 for measuring a force value that can be associated with an actuating force acting on the actuating surface 15 of the impact absorber cover 6. The force transducers 8 are disposed outside the steering axis D defined by the vehicle steering wheel 1, and disposed outside an accommodating space provided for accommodating the airbag initiation device 17, 18 and radially next to the airbag initiation device 17, 18.

Figure 3:
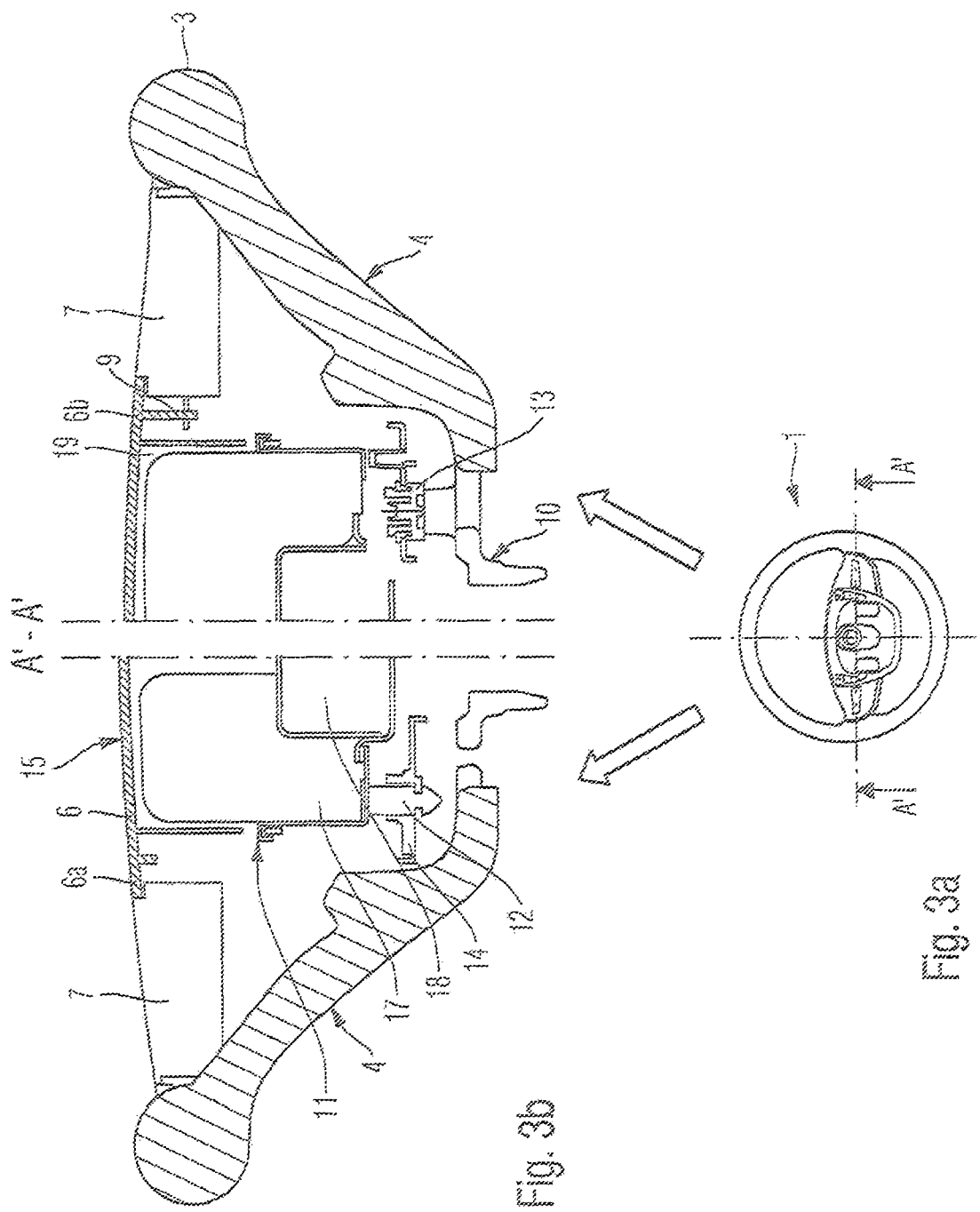
FIG. 3a shows a view with the position of the cut line A'-A' for explaining the sectional view of FIG. 3b.
FIG. 3b shows a sectional view of the vehicle steering wheel 1 according to the embodiment from FIGS. 1 and 2.

Moreover, the sectional view of the FIGS. 3a and 3b shows that the impact absorber cover 6 extends in a cantilevered manner across the hub region 10, bridging the accommodating space 19, which is configured so as to be bridging the accommodating space 19, which is provided for at least partially accommodating the airbag initiation device 17, 18 consisting of the gas generator 18 and the gas bag 17. As is also apparent therefrom, the impact absorber cover 6 is configured in such a manner that the actuating surface 15 extends across the accommodating space 19 into the projections 6a, 6b, while forming a continuous transition.

Figure 4:
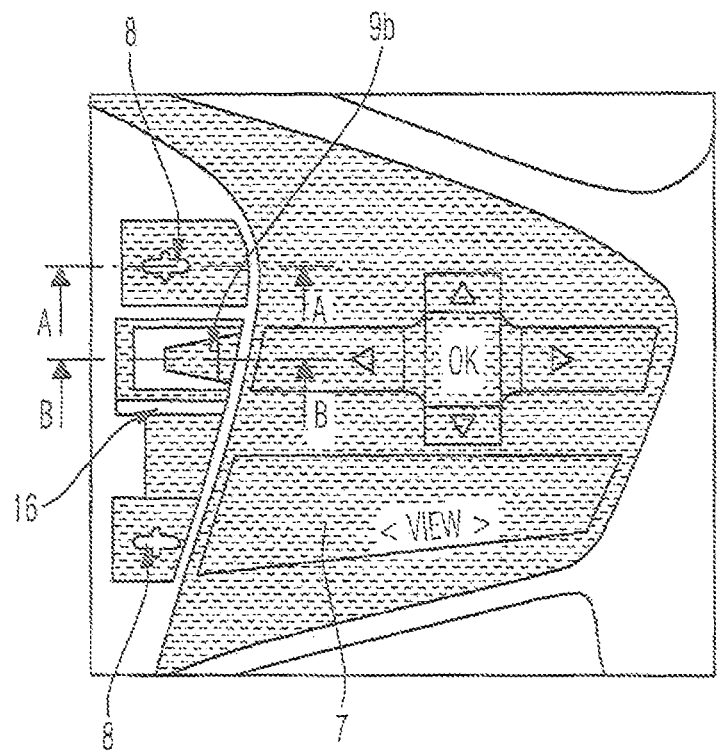
FIG. 4 shows a detailed view of the embodiment of the vehicle steering wheel 1 according to the embodiment from FIGS. 1 and 2.
Figure 5:
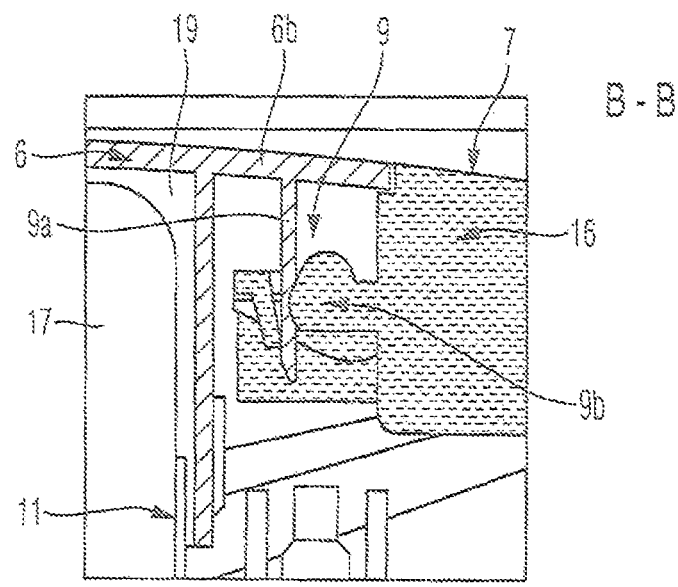
FIG. 5 shows a detailed sectional view of the embodiment of the vehicle steering wheel 1 according to the embodiment from FIGS. 1 and 2.
Figure 6:
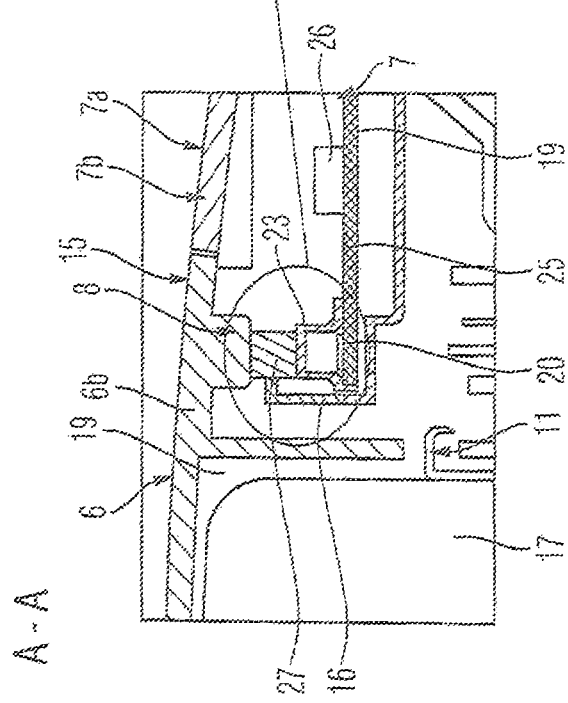
FIG. 6 shows a detailed sectional view of the embodiment of the vehicle steering wheel 1 according to the embodiment from FIGS. 1 and 2.

FIG. 4 is a detailed top view of the multi-functional operating member 7 with the impact absorber cover 6 removed. It shows the latching lug 9b, which establishes the snap-fit connection 9 between the impact absorber cover 6 and the operating member 7, and whose function can be seen in FIG. 5, which depicts the section along the section line B-B from FIG. 4. The latching lug 9b cooperates with the latching projection 9a protruding from the projection 6b by reaching into the latching recess of the former that the snap-fit connection 16, which limits the movability of the impact absorber cover 6, is formed. FIG. 6 corresponds to the section along the section line A-A from FIG. 4 and substantially shows the function of the optical force transducers 8 and of the resetting member 23 causing the elastic resetting of the impact absorber cover 6. An enlarged detailed view is apparent from FIG. 7, the resetting members 23 are each formed from an elastomer and with a dome shape, and are each disposed underneath one of the projections 6a, 6b in order to cause in each case the resetting of the impact absorber cover 6 from an actuated position into a non-actuated position.

As is apparent from FIG. 6, the operating member 7 in each case comprises one actuating part 7b whose surface 7a facing towards the driver transitions flush into the actuating surface 15 of the impact absorber cover 6 in a rest position of the actuating part 7b and a rest position, i.e. non-actuated position, of the impact absorber cover 6.

The resetting member 23 is supported, on the one hand, on a circuit board 25 associated with the multi-functional operating member 7 and, on the other hand, via a plunger 27, which is guided in the housing 16 of the multi-functional operating member 7, on the rear side, i.e. the side facing away from the driver, of the projection 6b of the impact absorber cover 6. The hollow volume 21 formed by the resetting member 23 and the circuit board 25 is used for arranging the optical force transducer 8, which is connected in an electrically conductive manner to an electronic evaluation unit 26, which is disposed on the circuit board 25 of the multi-functional operating member 7. The electronic evaluation unit 26 is configured to determine an actuating force value by means of the force values measured by the force transducers 8 and, if a predetermined value is exceeded, to trigger the acoustic output of the acoustic warning device of the vehicle.

The function of the optical force transducer 8 becomes clear in the FIGS. 7 and 8. The force transducer 8 includes a combination 20 of an optical transmitter 20a and an optical receiver 20b. The light emitted by the transmitter 20a is reflected on a reflector 22 in the direction of the receiver 20b.

The reflector 22 is disposed in the hollow volume 21 on the side of the resetting member 23 facing away from the plunger 27. The amount of light reflected by the reflector 22 onto the receiver 20b varies in a distinct manner with the deformation of the resetting member 23 caused by the actuation, and is thus a measure for the force value to be measured by the force transducer.

What is claimed is:

1. A vehicle steering wheel, comprising:
   a steering wheel body with a hub region for attachment to a steering shaft, with a steering wheel rim and with at least one spoke for attaching the steering wheel rim to the hub region;
   an airbag initiation device;
   an electromechanical triggering device for triggering an acoustic output by means of an acoustic warning device of the vehicle, wherein the triggering device has an impact absorber cover, which covers the hub region on the steering wheel body at least partially while forming an actuating surface, wherein the impact absorber cover is configured so as to be bridging an accommodating space, which is provided between the hub region and the impact absorber cover and provided for at least partially accommodating the airbag initiation device, and the impact absorber cover is mounted on the steering wheel body so as to be, under the influence of an actuating force on the actuating surface, elastically displaceable in a direction of the hub region and also self-resetting and/or is configured so as to be elastically deformable in the direction of the hub region and also self-resetting, and the impact absorber cover has at least one projection projecting laterally in a direction of the steering wheel rim beyond the accommodating space; and
   an operating member disposed solely in the volume of the at least one spoke, and the impact absorber cover is disposed laterally adjacent to the operating member;
   wherein the electromechanical triggering device further has at least one force transducer, which is disposed between the at least one projection and the steering wheel body and via which the impact absorber cover is supported on the steering wheel body, for measuring a force value that can be associated with an actuating force acting on the actuating surface of the impact absorber cover;
   wherein the electromechanical triggering device further has at least one electronic evaluation unit connected in an electrically conductive manner to the at least one force transducer in order to determine an actuating force value by means of the force value measured by the at least one force transducer and trigger the acoustic output of the acoustic warning device of the vehicle when a prescribed actuating force value condition is met; and
   wherein the at least one force transducer is attached to a circuit board of the operating member.

2. The vehicle steering wheel according to claim 1, wherein the actuating surface extends across the accommodating space into the at least one projection.

3. The vehicle steering wheel according to claim 1, wherein at least two projections with at least one force transducer each are provided.

4. The vehicle steering wheel according to claim 1, wherein the at least one electronic evaluation unit has a central evaluating unit for determining an actuating force from force values of several force transducers.

5. The vehicle steering wheel according to claim 1, wherein the at least one force transducer is provided between the at least one spoke and the at least one projection.

6. The vehicle steering wheel according to claim 1, wherein the at least one force transducer is disposed outside a steering axis defined by the vehicle steering wheel.

7. The vehicle steering wheel according to claim 1, wherein the at least one force transducer measures the force value by any one of: optically, capacitively, inductively and resistively.

8. The vehicle steering wheel according to claim 1, wherein means for biasing the at least one force transducer are provided.

9. The vehicle steering wheel according to claim 1, wherein several spokes are provided and the impact absorber cover has several projections that each extend along one of the spokes, so that the impact absorber cover extends from spoke to spoke while bridging the hub region.

10. The vehicle steering wheel according to claim 1, wherein the operating member is a multifunction operating member.

11. The vehicle steering wheel according to claim 1 is used in a motor vehicle.

12. The vehicle steering wheel according to claim 1, wherein the actuating surface extends across the accommodating space into the at least one projection while forming a continuous transition.

13. The vehicle steering wheel according to claim 1, wherein the at least one electronic evaluation unit has a central evaluating unit for determining the actuating force value from force values of all force transducers.

14. The vehicle steering wheel according to claim 1, wherein the at least one force transducer is disposed outside the accommodating space provided for accommodating the airbag initiation device.

15. The vehicle steering wheel according to claim 1, wherein the at least one force transducer is disposed radially next to the airbag initiation device.

16. The vehicle steering wheel according to claim 1, wherein a dome consisting of elastic material is provided as a resetting member causing the elastic resetting of the impact absorber cover.

17. The vehicle steering wheel according to claim 16, wherein the at least one force transducer is disposed in a hollow volume defined by the dome.

18. The vehicle steering wheel according to claim 1, wherein the operating member is one of an electronic or electromechanical operating member.

19. The vehicle steering wheel according to claim 18, wherein the impact absorber cover is fixed to the operating member via a snap-fit connection, which also has a limiting effect on the mobility of at least one of: the impact absorber cover and a positioning protrusion.

20. The vehicle steering wheel according to claim 18, wherein the operating member further comprises at least one of: an actuating part and a faceplate, wherein a surface facing towards a driver transitions flush into the actuating surface of the impact absorber cover in a rest position of the actuating part and a rest position of the impact absorber cover.

* * * * *